US007110556B2

(12) United States Patent
Aarts et al.

(10) Patent No.: US 7,110,556 B2

(45) Date of Patent: Sep. 19, 2006

(54) MULTICHANNEL AUDIO SIGNAL PROCESSING DEVICE

(75) Inventors: Ronaldus Maria Aarts, Eindhoven (NL); Fransiscus Marinus Jozephus De Bont, Eindhoven (NL); Paulus Henricus Antonius Dillen, Eindhoven (NL); Augustus Josephus Elizabeth Maria Janssen, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 908 days.

(21) Appl. No.: 09/741,918

(22) Filed: Dec. 20, 2000

(65) Prior Publication Data

US 2001/0031055 A1 Oct. 18, 2001

(30) Foreign Application Priority Data

Dec. 24, 1999 (EP) .................................. 99204547

(51) Int. Cl.
*H03G 5/00* (2006.01)
*G10L 21/00* (2006.01)

(52) U.S. Cl. ........................................ 381/98; 704/500

(58) Field of Classification Search .................. 381/98, 381/99, 103, 307; 700/94; 704/500–504
See application file for complete search history.

(56) References Cited

U.S. PATENT DOCUMENTS

| | | | | | |
|---|---|---|---|---|---|
| 5,280,561 | A | * | 1/1994 | Satoh et al. | 704/200 |
| 5,384,856 | A | * | 1/1995 | Kyouno et al. | 381/103 |
| 5,581,651 | A | * | 12/1996 | Ishino et al. | 704/205 |
| 6,055,502 | A | * | 4/2000 | Kitamura | 704/500 |
| 6,246,345 | B1 | * | 6/2001 | Davidson et al. | 341/51 |
| 6,381,333 | B1 | * | 4/2002 | Suzuki | 381/18 |
| 6,446,037 | B1 | * | 9/2002 | Fielder et al. | 704/229 |
| 6,460,016 | B1 | * | 10/2002 | Sueyoshi et al. | 704/200.1 |
| 6,487,535 | B1 | * | 11/2002 | Smyth et al. | 704/500 |
| 6,498,852 | B1 | * | 12/2002 | Grimani | 381/18 |
| 6,725,110 | B1 | * | 4/2004 | Suzuki | 700/94 |

* cited by examiner

*Primary Examiner*—Laura A. Grier
(74) *Attorney, Agent, or Firm*—Edward W. Goodman

(57) ABSTRACT

An audio signal processing device includes a signal supply for supplying coded audio signal over more than one input channel and, per input channel, over separate frequency sub-bands domain sub-channels. Further filters are used to decode and synthesize the audio signals over the total frequency domain. Sub-band combination circuits are used for supplying respective input channels to the same sub-band combination circuit the signals from the same sub-band frequency domain audio signals.

8 Claims, 4 Drawing Sheets

MULTICHANNEL AUDIO SIGNAL PROCESSING DEVICE

BACKGROUND OF THE INVENTION

1. Field of the Invention

The invention relates to a multi-channel audio signal processing device including signal supply means for supplying coded audio signals through several input channels, and for each input channel, through separate sub-channels which cover distinct frequency sub-band domains, and including one or several synthesis or reconstruction filters (SFB) for decoding and synthesizing audio signals over the total frequency domain covered by the sub-band domains.

2. Description of the Related Art

It is usual, in this case, to include filter means, such as main-related filters or sound-widening filter means of a different kind, downstream of the synthesis or reconstruction filters in the signal transport direction, i.e., after the reconstruction of the broadband audio signals. The same number of synthesis or reconstruction filters will then be present as there are input channels. The main-related filters or sound-widening filter means of a different kind, also referred to as “incredible sound filters (ISF)”, are then constructed as broadband filters. Instead of such “incredible sound filters”, alternative filter means may be provided in the audio signal processing device, such as, for example, equalization or different tone control filters. These, too, will be provided downstream of the synthesis or reconstruction filters.

SUMMARY OF THE INVENTION

The invention has for its object to simplify such an audio signal processing device without detracting from the quality of the sound reproduction.

According to the invention, the multi-channel audio signal processing device as defined in the opening paragraph is characterized in that the device further comprises sub-band combination circuits, each sub-band combination circuit being supplied with audio signals through respective input channels which lie in one and the same sub-band frequency domain, while the output signals of a sub-band combination circuit covering an associated frequency sub-domain are supplied to a synthesis filter. This means that only one synthesis or reconstruction filter is necessary for each sound reproduction channel, independently of the number of input channels. For example, if audio signals are offered to seven input channels, whereas the sound is reproduced through no more than two sound reproduction channels, e.g., as a result of virtual spatial widening, only two synthesis or reconstruction filters are necessary, instead of seven as required in the known audio signal processing devices. In a usual stereo sound reproduction, for example, only 2 or 2.1 synthesis or reconstruction filters are necessary for 5.1 MPEG input channels. It is usual, in audio signal processing devices, as noted above, to include filter means, such as main-related filters or sound-widening filter means of a different type, downstream of the synthesis or reconstruction filters as seen in the signal transport direction. It is also possible to provide, for example, equalization filters in this manner.

According to the invention, however, it becomes possible to provide filtering means upstream of the synthesis filters as seen in the transport direction. These filter means may then be of a narrow-band type and may, accordingly, be of a simpler construction.

It is thus possible for the filter means to be included in the connection between associated sub-band combination circuits and a synthesis filter. An equal filtering then takes place for all audio signals supplied through the input sub-channels covering the same frequency sub-domain, which results in an equal filtering of the audio signals supplied through the respective input channels. The filter means may comprise, for example, equalization or different tone control filters in a filtering mode as described above.

It is also possible for the filter means to be included in the input sub-channels. The filter means may then be of a particularly simple construction. It then becomes possible, in particular, to form the filter means by elements which introduce a scale factor. Irrespective of the location where the filter means is positioned, the filter means may, in either case, comprise narrow-band filters for obtaining a desired virtual spatial widening from which the audio signals can be heard through distinct reproduction channels.

BRIEF DESCRIPTION OF THE DRAWINGS

The invention will now be explained in more detail with reference to the accompanying drawings, in which.

DESCRIPTION OF THE PREFERRED EMBODIMENTS

Figure 1:
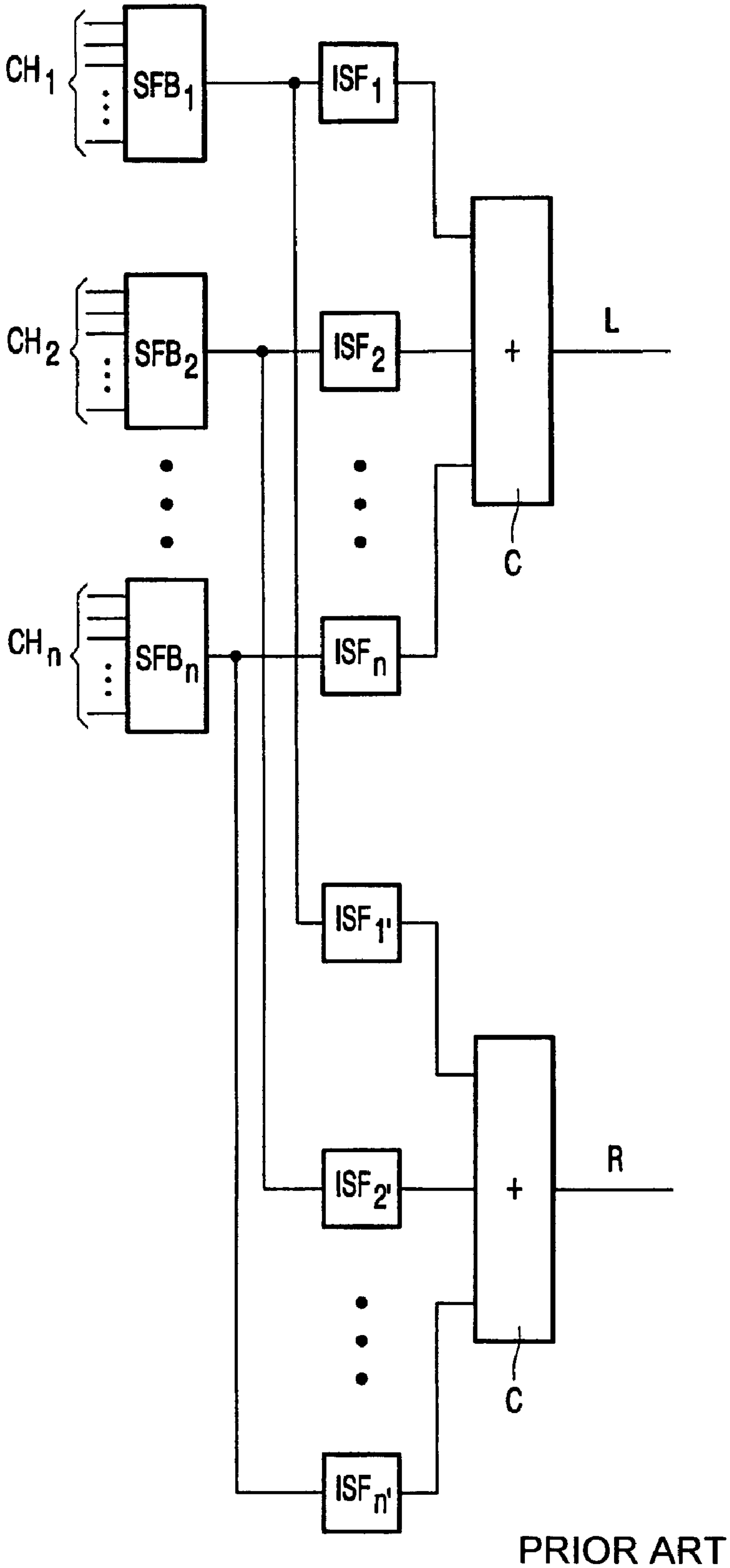
PRIOR ART FIG. 1
FIG. 1 shows an audio signal processing device according to the present state of the art.

In the multi-channel audio signal processing device shown in FIG. 1, the input signals are derived from a frequency sub-band encoded storage medium, such as, for example, an optical disc or a DCC (digital compact cassette), or from a transmission system. The audio signals laid down on this medium or transmitted are distributed over separate channels, and are distributed within each channel over separate frequency sub-bands in accordance with known encoding techniques by means of analysis filter banks. See, for example, “Ken C. Pohlmann, Principals of Digital Audio, 3$^{rd}$ ed., McGraw-Hill Inc., 1995”, on this subject. The coded signals, obtained from the storage medium or through transmission, are supplied through channels CH1, CH2, . . . , CHn to synthesis filter banks SFB1, SFB2, . . . , SFBn. The supplied signals are decoded by these synthesis filter banks, and audio signals are obtained over the total frequency domain covered by the sub-band domains. These broadband audio signals are joined together, via main-related filters ISF1, ISF2, . . . , ISFn, and ISF1', ISF2', . . . , ISFn', by combination circuits C and conducted to the sound reproduction means of the reproduction channels present, i.e., in the embodiment shown, to two stereo reproduction channels L and R.

Figure 2:
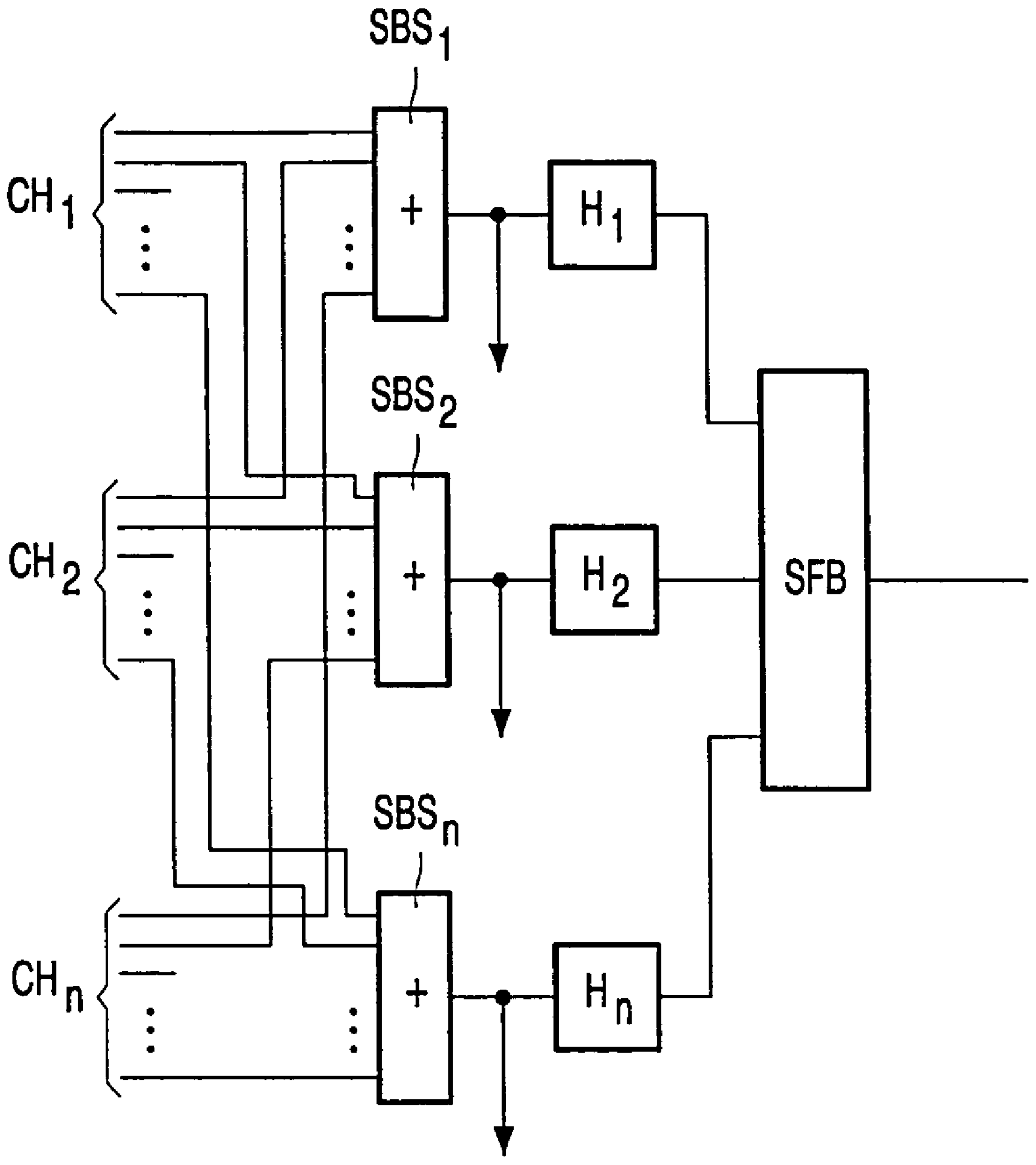
FIG. 2 shows a first embodiment of an audio signal processing device according to the invention, shown for only one sound reproduction channel.

In the embodiment of the invention as shown in FIG. 2, the coded signals, originating from the storage medium or obtained through transmission, are supplied to sub-band combination circuits SBS1, SBS2, . . . , SBSn through the channels CH1, CH2, . . . , CHn. The output signals of these sub-band combination circuits are supplied, through respective equalization filters H1, H2, . . . , Hn, to the synthesis filter SFB, and from there to the sound reproduction means of a reproduction channel. Although this is not shown in FIG. 2, said output signals may also be supplied to a further synthesis filter through equalization filters, and from there to the sound reproduction means of a further reproduction channel.

Figure 3:
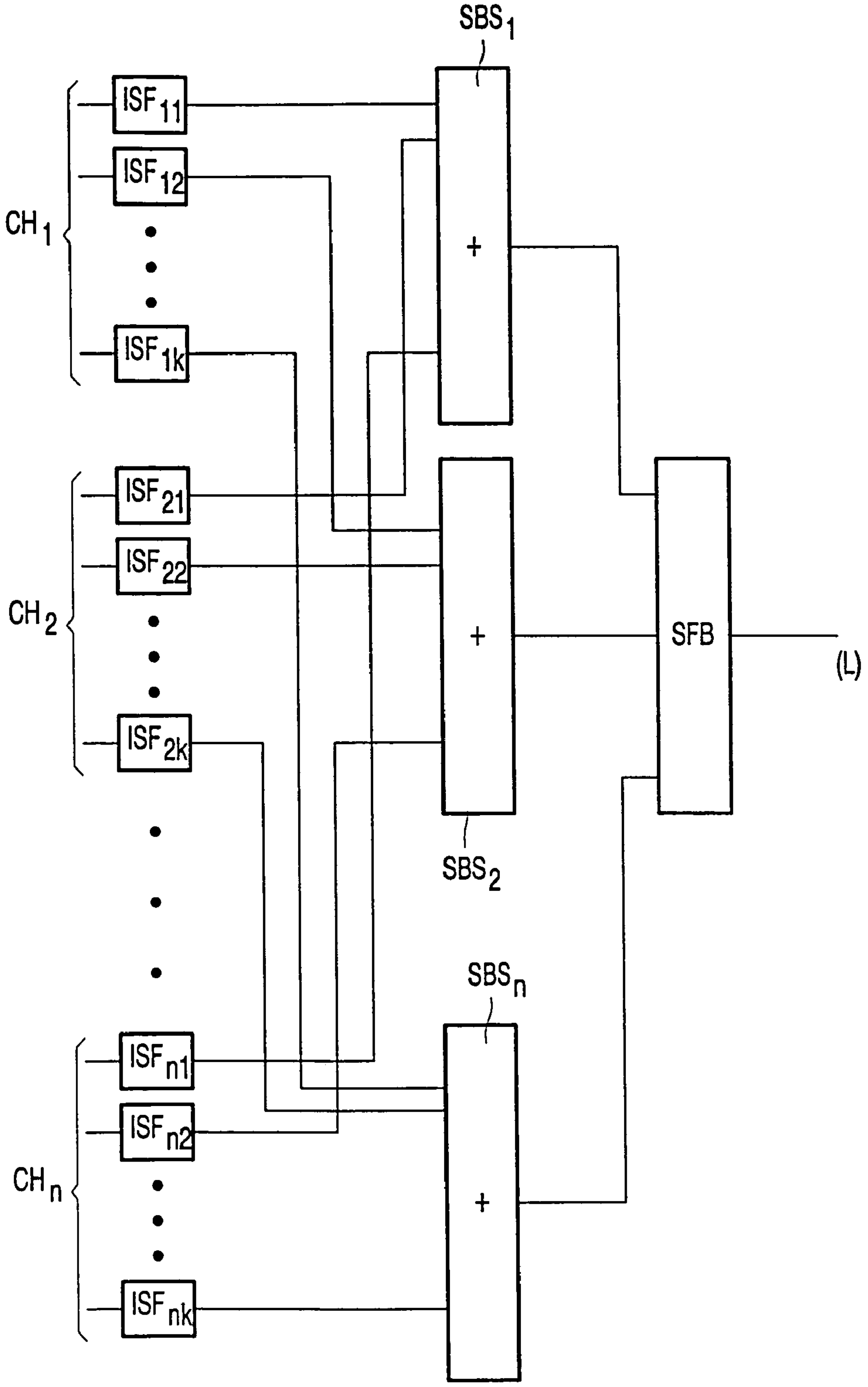
FIG. 3 shows a second embodiment of an audio signal processing device according to the invention, shown for only one sound reproduction channel.

In the embodiment of the invention as shown in FIG. 3, the coded signals, originating from the storage medium or obtained through transmission, are combined in accordance with frequency sub-bands through filters ISF11, ISF12, . . . , ISF1*k*; ISF21, ISF22, ISF2*k*; . . . ; ISFn1, ISFn2, . . . , ISFnk present in all sub-channels of the individual input channels, i.e., in accordance with ISF11, ISF21, . . . , ISFn1; ISF12, ISF22, . . . , ISFn2; . . . ; ISF1*k*, ISF2*k*, . . . , ISFnk, by respective sub-band combination circuits SBS1, SBS2, . . . , SBSn, and supplied to a synthesis filter bank SFB. The supplied channels are coded by this synthesis filter bank and audio signals are obtained, again covering the total frequency domain corresponding to the sub-band domains. These audio signals are subsequently conducted to the sound reproduction means of a corresponding reproduction channel (L). A stereo sound reproduction can be obtained in that the input signals of the audio signal processing device are also supplied to a second circuit identical to the one depicted in FIG. 3, and in that subsequently, the audio signals obtained by means of this circuit are supplied to the sound reproduction means of a second reproduction channel R. If a sufficiently fine subdivision into frequency domains is achieved in this embodiment of the invention, the filters ISF can be given a comparatively simple construction. It was found that the provision of no more than scale factors is sufficient.

Figure 4:
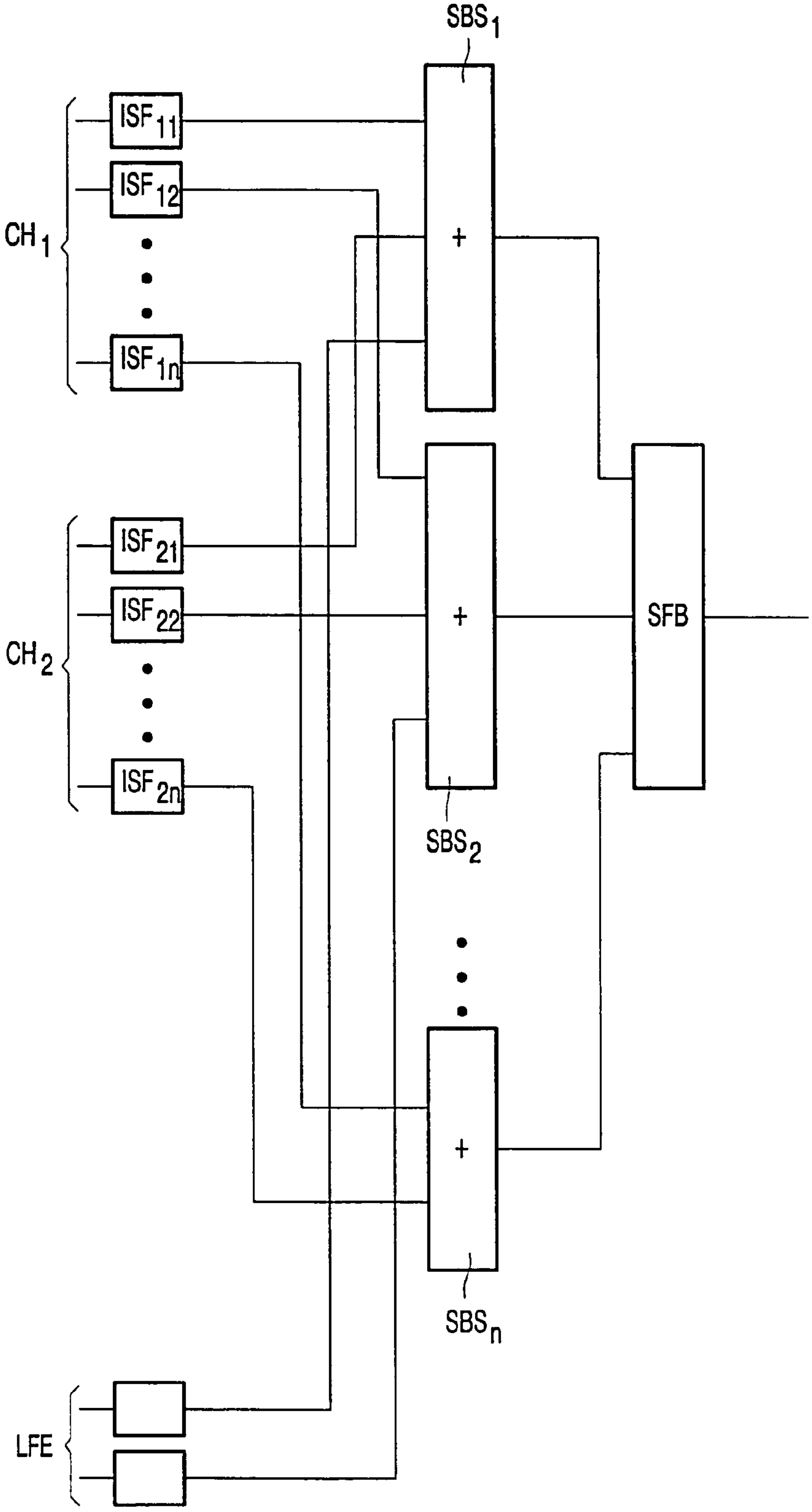
FIG. 4 shows a third embodiment of an audio signal processing device according to the invention for 2.1 input channels, only one sound reproduction channel being depicted.

In the embodiment shown in FIG. 4, the coded signals, originating from the storage medium or obtained through transmission, are supplied through 2.1 channels, i.e., through 2 channels covering the entire bandwidth and a so-called "low frequency enhancement (LFE) channel". The signals supplied through the two channels covering the full bandwidth are conducted through "incredible sound filters" ISF11, ISF12, . . . , ISF1*n*, and ISF21, ISF22, . . . , ISF2*n* to the respective sub-band combination circuits SBS1, SBS2, . . . , SBSn, whereas the signals supplied through the LFE channel are only supplied to the sub-band combination circuits SBS1 and SBS2 which cover the lowest frequency sub-band domains. The output signals of the sub-band combination circuits are again supplied to a synthesis filter SFB. The output signals of this synthesis filter are subsequently passed on to the sound reproduction means of a corresponding reproduction channel (L). It is true, again, that a stereo sound reproduction can be obtained in that the input signals of the audio signal processing device are also supplied to a second circuit identical to the one depicted in FIG. 4, and in that subsequently, the audio signals obtained by means of this circuit are supplied to the sound reproduction means of a second reproduction channel R. If a usual 5.1 channel arrangement is necessary in this case, three more channels are to be added in this embodiment in a manner as shown in FIG. 3. Five virtual sound reproduction sources may then be created by means of two sound reproduction channels.

It will be obvious from the above that any number of input channels required may be combined with any number of sound reproduction channels, which may or may not be virtual. Neither are the filter means limited to the "incredible sound filters" and equalization filters mentioned here; it is alternatively possible to construct the filter means as a volume control, especially in a configuration as shown in FIG. 2. The filter means, moreover, may be chosen to be fixed ones or adjustable ones.

The invention claimed is:

1. A multi-channel audio signal processing device comprising:

signal supply means for supplying coded audio signals through several input channels, and for each input channel, through separate sub-channels covering distinct frequency sub-band domains; and synthesis or reconstruction filters (SFB) for decoding and synthesizing audio signals over the total frequency domain covered by the sub-band domains, characterized in that said multi-channel audio signal processing device further comprises:

sub-band combination circuits, each sub-band combination circuit being supplied with audio signals through respective input channels which lie in one and the same sub-band frequency domain, while the output signals of a sub-band combination circuit covering an associated frequency sub-domain are supplied to one of said synthesis filters for each output channel of said multi-channel audio signal processing device.

2. A multi-channel audio signal processing device comprising:

signal supply means for supplying coded audio signals through several input channels, and for each input channel, through separate sub-channels covering distinct frequency sub-band domains; and synthesis or reconstruction filters (SFB) for decoding and synthesizing audio signals over the total frequency domain covered by the sub-band domains, characterized in that said multi-channel audio signal processing device further comprises:

sub-band combination circuits, each sub-band combination circuit being supplied with audio signals through respective input channels which lie in one and the same sub-band frequency domain, while the output signals of a sub-band combination circuit covering an associated frequency sub-domain are supplied to one of said synthesis filters for each output channel of said multi-channel audio signal processing device; and filter means coupled to inputs of the respective synthesis filters.

3. The multi-channel audio signal processing device as claimed in claim 2, characterized in that the filter means comprise filters for obtaining a desired virtual spatial widening from which the audio signals can be heard through separate reproduction channels.

4. The multi-channel audio signal processing device as claimed in claim 2, characterized in that the filter means comprise equalization filters or tone control filters of an alternative kind.

5. A multi-channel audio signal processing device comprising:

signal supply means for supplying coded audio signals through several input channels, and for each input channel, through separate sub-channels covering distinct frequency sub-band domains; and synthesis or reconstruction filters (SFB) for decoding and synthesizing audio signals over the total frequency domain covered by the sub-band domains, characterized in that said multi-channel audio signal processing device further comprises:

sub-band combination circuits, each sub-band combination circuit being supplied with audio signals through respective input channels which lie in one and the same sub-band frequency domain, while the output signals of a sub-band combination circuit covering an associated frequency sub-domain are supplied to one of said synthesis filters for each output channel of said multi-channel audio signal processing device; and filter means coupled between the relevant sub-band combination circuits and the respective synthesis filter.

6. A multi-channel audio signal processing device comprising:

signal supply means for supplying coded audio signals through several input channels, and for each input channel, through separate sub-channels covering distinct frequency sub-band domains; and synthesis or reconstruction filters (SFB) for decoding and synthesizing audio signals over the total frequency domain covered by the sub-band domains, characterized in that said multi-channel audio signal processing device further comprises:

sub-band combination circuits, each sub-band combination circuit being supplied with audio signals through respective input channels which lie in one and the same sub-band frequency domain, while the output signals of a sub-band combination circuit covering an associated frequency sub-domain are supplied to one of said synthesis filters for each output channel of said multi-channel audio signal processing device; and filter means coupled between the input sub-channels and inputs of the sub-band combination circuits.

7. The multi-channel audio signal processing device as claimed in claim 6, characterized in that the filter means comprise elements for introducing a scale factor.

8. A method for processing an audio signal comprising the steps:

receiving a first plurality of coded audio signals in separate channels, each coded audio signal having a second plurality of different frequency sub-bands;

combining respective frequency sub-bands of the second plurality of sub-band of each of the first plurality of coded audio signals to form a third plurality of combined signals; and synthesis filtering and decoding the third plurality of combined signals.

* * * * *